United States Patent [19]

Wilhelm et al.

[11] Patent Number: 5,543,994
[45] Date of Patent: Aug. 6, 1996

[54] MOSFET DRIVER WITH FAULT REPORTING OUTPUTS

[75] Inventors: Dana Wilhelm, Temple City; Talbott M. Houk, Culver City, both of Calif.

[73] Assignee: International Rectifier Corporation, El Segundo, Calif.

[21] Appl. No.: 394,702

[22] Filed: Feb. 27, 1995

[51] Int. Cl.$^6$ ..................................................... H02H 7/12
[52] U.S. Cl. .............................. 361/18; 361/100; 361/87; 363/50
[58] Field of Search ................................ 361/18, 87, 98, 361/100, 101; 363/50, 52

[56] References Cited

U.S. PATENT DOCUMENTS 4,893,211  1/1990  Bynum et al. ............................ 361/87
5,164,659  11/1992  Schultz et al. ............................ 361/18

Primary Examiner—Todd DeBoer
Attorney, Agent, or Firm—Ostrolenk, Faber, Gerb & Soffen, LLP

[57] ABSTRACT

The fault latch and filter circuit used in a MOSgated driver for a high side power MOSgated device to turn off the MOSgated device high side output in response to a given fault condition is located in the high side of the circuit and in a floating well of a semiconductor chip containing the driver circuit. The fault latch and filter are connected to the output driver circuit through a gate which also receives the high side filter and latch which are operated by the input control logic circuits through a level-shift up circuit. The fault latch circuit has an output which is level-shifted down by a single PMOS device to a fault reporting latch circuit on the low side of the device.

14 Claims, 3 Drawing Sheets

5,543,994

MOSFET DRIVER WITH FAULT REPORTING OUTPUTS

FIELD OF THE INVENTION

This invention relates to MOSgated driver circuits, and more particularly relates to a novel MOSgated driver circuit for high side switching circuits with overcurrent sensing, shutdown and reporting outputs.

BACKGROUND OF THE INVENTION

MOSgated drivers which are circuits commonly integrated into a monolithic chip are known for providing output signals which can trigger the gate of a high side power MOSgated device. A typical MOSgate driver is the IR2110 driver made and sold by the International Rectifier Corporation, the assignee of the present invention. Such devices are also described in copending application Ser. Nos. 08/299,561, filed Sep. 1, 1994, entitled "MOSgate Driver Integrated Circuit, etc." and 08/273,695 filed Jul. 12, 1994, entitled "Reset Dominant Level-Shift Circuit, etc.".

Such drivers also have means for turning off the high side device if a fault or predetermined overcurrent (both hereinafter sometimes referred to as a fault condition or fault current) flows through the main power device and to provide an output signal indicating the presence of the fault. The delay time for shutting off the main power device includes the delays which are inherent in the latch circuits in the high and low sides of the driver. Thus, it is common to have all low side (low voltage to ground) circuits on the monolithic chip body and the high side circuits in a floating well in the chip surface. Such structures are shown in copending application Ser. No. 08/299,561, referred to above. Therefore, in the event of a fault or overcurrent, a sensing signal in the high side circuit is level-shifted down, through two PMOS devices which control the inputs to set and reset latches respectively of a filter and latch circuit in the low side of the circuit. This latch then produces a fault input to the control logic circuit on the low side of the circuit and also causes the report of the fault condition. The control logic then produces a turn-off signal which is level-shifted to the high side and to a high side filter and latch which remove the output signal to the MOS-controlled power device.

This circuitry introduces the delay of the filters in both the high side and low side latches into the minimum time needed to turn off the power MOSgated device.

BRIEF SUMMARY OF THE INVENTION

In accordance with the invention, the low side fault latch circuit of the prior art is moved to the high side of the circuit. The latch output is then level-shifted down by a single PMOS device to a fault indicator device. Both the original high side latch connected to the driver for the output terminal to the high side power MOS device and the fault latch which is coupled to the low side are reset after a fault by the input signal to the circuit. It is, therefore, no longer necessary to have multiple PMOS level-shift down devices to indicate, at the low side, that a fault condition has occurred.

Accordingly, the present invention has several inherent advantages relative to the device of the prior art. The first is that the circuitry is simplified because of the need for only a single PMOS level-shift down device and the omission of the additional support circuitry which is necessary when multiple level-shift down devices are used. Another advantage is that the speed with which the fault is acted upon is reduced. This is facilitated by the fact that it is no longer necessary to wait for the operation of the former low side filter and latch for the output to be disconnected from the power MOS device because the output of that former device is now in the high side and its output is connected to the output driver through a gate which also receives the conventional input signal which is level-shifted up to the high side.

Other features and advantages of the present invention will become apparent from the following description of the invention which refers to the accompanying drawings.

DETAILED DESCRIPTION OF THE INVENTION

Figure 1:
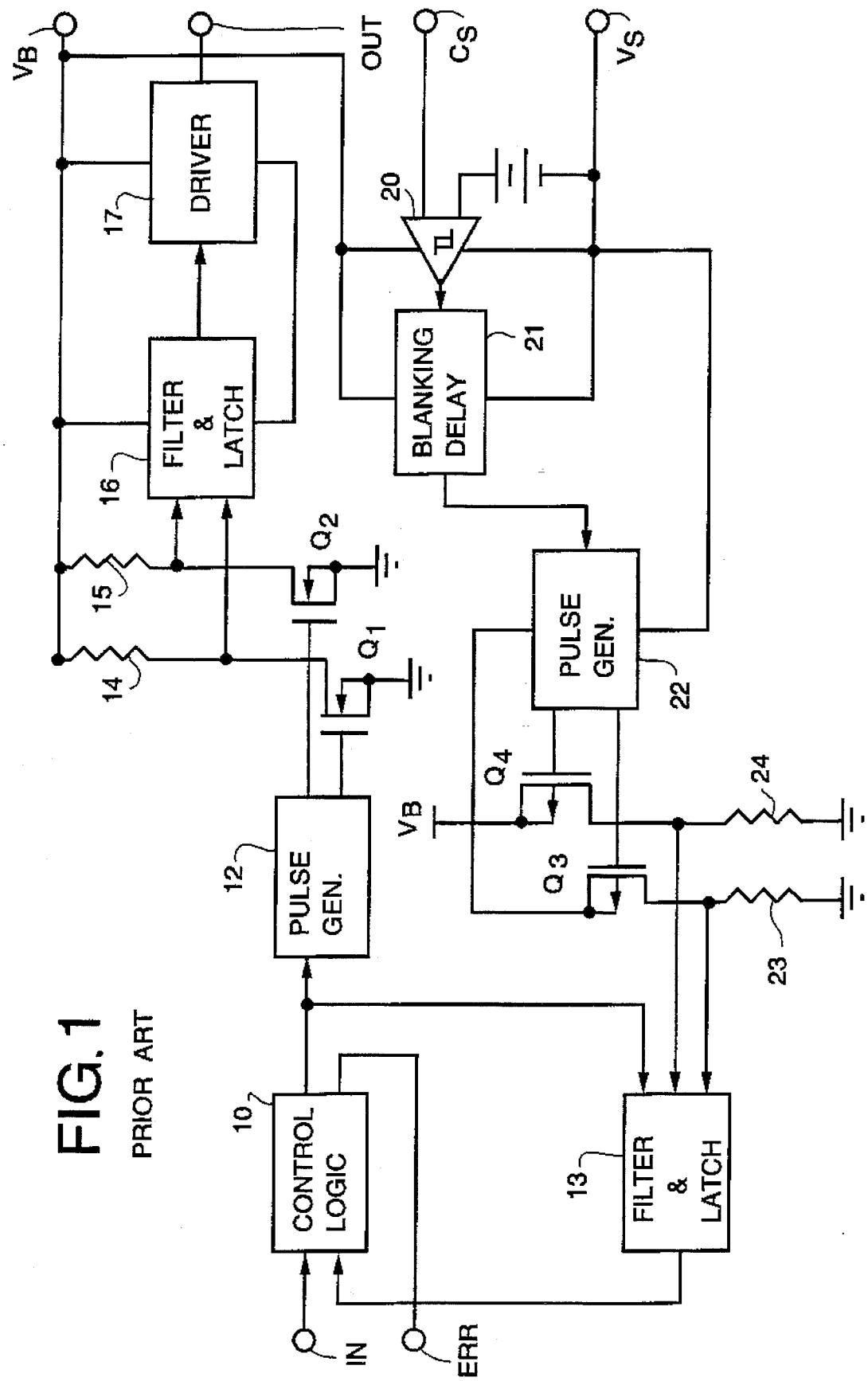
FIG. 1 shows a block diagram of a prior art high side MOSgated device driver with overcurrent sensing, shutdown and reporting.

Referring first to FIG. 1, there is shown a block diagram of a prior art device, specifically of the type employed in the MOSgated driver IR2125 manufactured and sold by the International Rectifier Corporation, the assignee of the present invention, which is shown and described in pending application Ser. No. 08/299,561 referred to above, the disclosure of which is incorporated herein by reference.

The circuit of FIG. 1 is implemented as a monolithic circuit integrated into a single silicon chip having terminals or pin outs including the input signal pin "IN", the error signal pin "ERR", a power supply terminal $V_B$, a high side output terminal "OUT", which is to be connected to the gate of a high side MOSgated power semiconductor device, such as a power MOSFET, IGBT or MOSgated thyristor, a current sense input "$C_S$" which receives a signal related to the current in the MOSgated device being controlled, and a "$V_S$" terminal. Also provided is a ground pin connected to the device grounds which are shown.

The signal at "ERR" pin can be connected to any desired fault indicator or fault responsive circuit.

Input pin "IN" is connected to a known control logic circuit 10 which receives a low voltage logic input and produces a related output to pulse generator 12, and to filter and latch circuit 13. The pulse generator 12 is connected to NMOS transistors $Q_1$ and $Q_2$ which are in series with resistors 14 and 15 respectively, and act to level-shift up the signal from control logic 10 and pulse generator 12 to set or reset the high side latch 16 to turn off or on a MOSgated device at terminal "OUT" through driver circuit 17.

A "reporting" circuit for reporting an output status signal to control logic circuit 10 consists of the comparator 20 which compares the current sense signal at terminal "$C_S$" to the reference at "$V_S$". An output is provided from comparator 20 if the current sense input to "$C_S$" exceeds a given value, to apply a signal to blanking delay circuit 21, and pulse generator 22. The output of pulse generator 22 is level-shifted down by PMOS devices $Q_3$ and $Q_4$ which are in series with resistors 23 and 24 respectively, to report the output status through filter and latch circuit 13, to control logic circuit 10.

The circuit of FIG. 1 operates such that, when the current flowing through a high side switch driven by the output at terminal "OUT" exceeds a given value, as due to an overload or fault current, a set signal will be level-shifted down to the low side latch 13. Conversely, if the current in the high side switch returns to a point below a predetermined level, a reset signal is level-shifted down to the low side latch 13.

The output of low side latch 13 in turn feeds into control logic 10. Control logic 10 will then determine the state of the output power circuit depending on the signals which are applied to the "IN" pins along with the output of low side latch 13. For the circuit of FIG. 1 to shut down the output if there is an overcurrent condition, it is required to level-shift down a status signal at pulse generator 22 which, in turn, will level-shift up a reset signal to latch 16 to shut off the signal at terminal "OUT" and the high side switch. The fact of the shutdown can be reported to an indicator or the like at "ERR" pin.

Thus, the circuits 10 and 13, which determine whether or not and when to shut down the output, are contained in the low side of the circuit. As will be seen from copending application Ser. No. 08/299,561 referred to above, the low side of the monolithic circuit is in the non-floating portion of the chip while the high side circuits are contained within a floating well in the main chip surface.

While this allows for control flexibility, it also limits the minimum shut-down time to at least that of the delay of level-shift down filter in circuit 13 plus the delay of the level-shift up filter in circuit 16. There will also be added delay due to the comparator 20 and propagation delays through the control logic and latches to further increase the minimum shutdown time delay.

In accordance with the invention, the logic used to determine whether or not and when to shut down the high side output is transferred to the high side and, in a monolithic chip, to the high side floating well. This avoids the delay of the signal having to be level-shifted both down and then back up, as in the circuit of FIG. 1.

Furthermore, with the novel circuit of the invention, only one PMOS level-shift transistor is needed. This is because the only time the high side switch status is switched down to the low side of the circuit is when there is an overcurrent or fault condition. Therefore, only one signal is necessary to set a latch on the low side. A second PMOS device, for example, $Q_4$ of FIG. 1, is not needed to reset the low side latch 13 since it will be reset each time the "IN" pin is cycled. Similarly, each of the latches in the high side of the circuit of the invention will be reset by a cycling of the "IN" pin.

Figure 2:
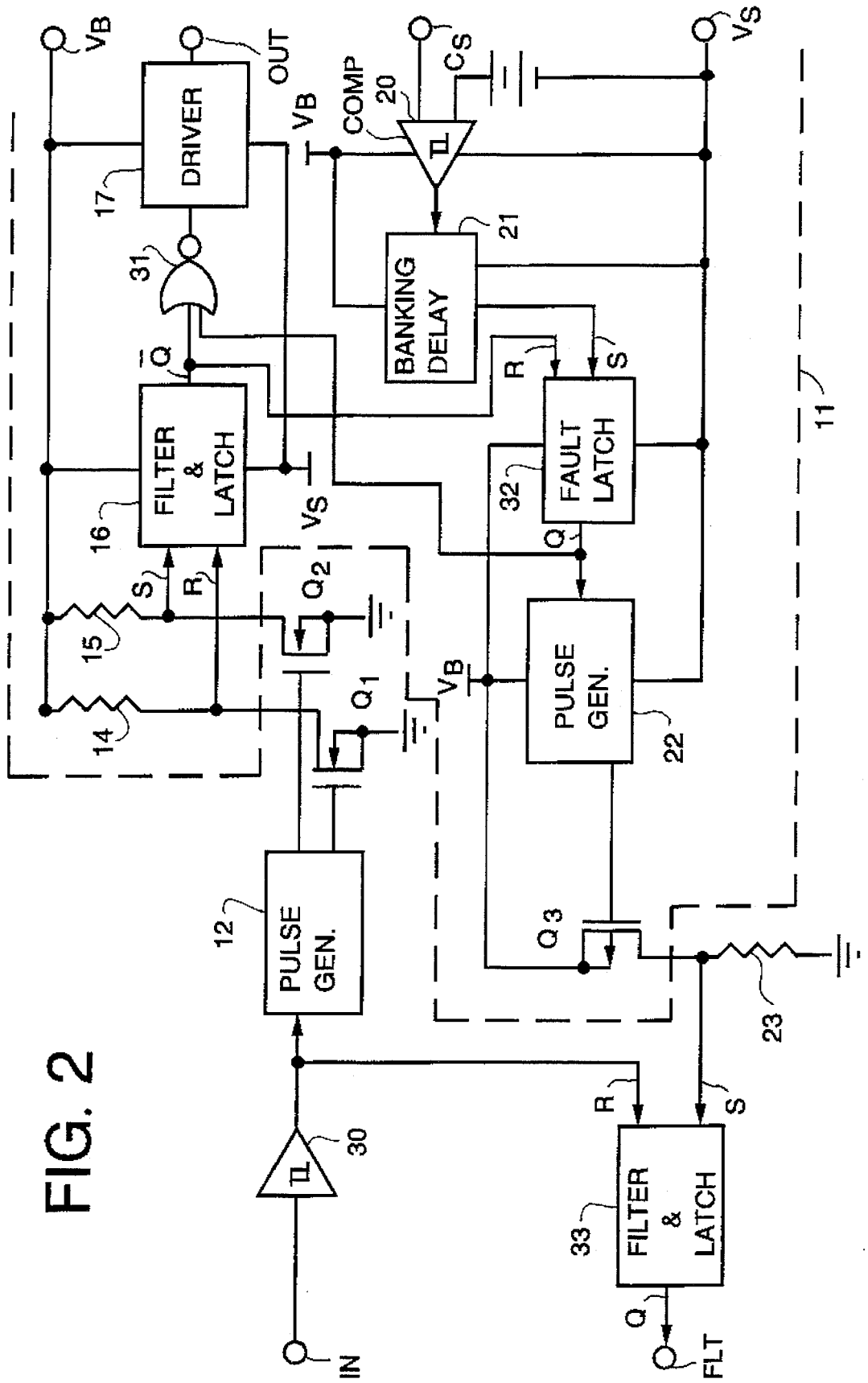
FIG. 2 is a block diagram similar to FIG. 1 and shows the novel circuit of the invention.

FIG. 2 is a block diagram of the circuit of the present invention wherein all circuit parts having the same identifying numeral or name correspond to those components of FIG. 1.

Referring to FIG. 2, it will be noted that control logic circuit 30 (which, in this case, is a Schmitt trigger) still produces a control signal pulse generator 12 which is level-shifted and coupled through filter and latch circuit 16. However, circuit 16 is connected to one input of gate 31 which is, in turn, connected to driver 17.

In accordance with the invention, filter and latch 13 of FIG. 1 are moved to the high side of the circuit and are implemented as R-S latch 32 having its set terminal "S" connected to the output of blanking delay 21 and its reset terminal "R" connected to the Q pin of R-S latch 16. The other input to gate 31 is connected to the Q pin of R-S latch 32. Thus, if a fault condition or overcurrent condition exists in the output circuit which sets latch 32, the driver 17 turns off.

The Q pin of latch 32 is also connected to pulse generator 22 to operate level-shift down PMOS transistor $Q_3$. This circuit operates to operate the set pin "S" of R-S latch 33 in response to an overcurrent or fault condition, producing an output signal at terminal Q of latch 33 and at the fault pin "FLT".

It will be noted that latches 16, 32 and 33 are all reset by the cycling of the input pin "IN". Further, the fault latch 32 is now in the high side of the circuit and is in the high side floating well of the chip, thereby reducing turn-off delay time formerly needed for the latch in the low side of the circuit. The reduction of PMOS transistor $Q_4$ also simplifies the circuit.

Figure 3:
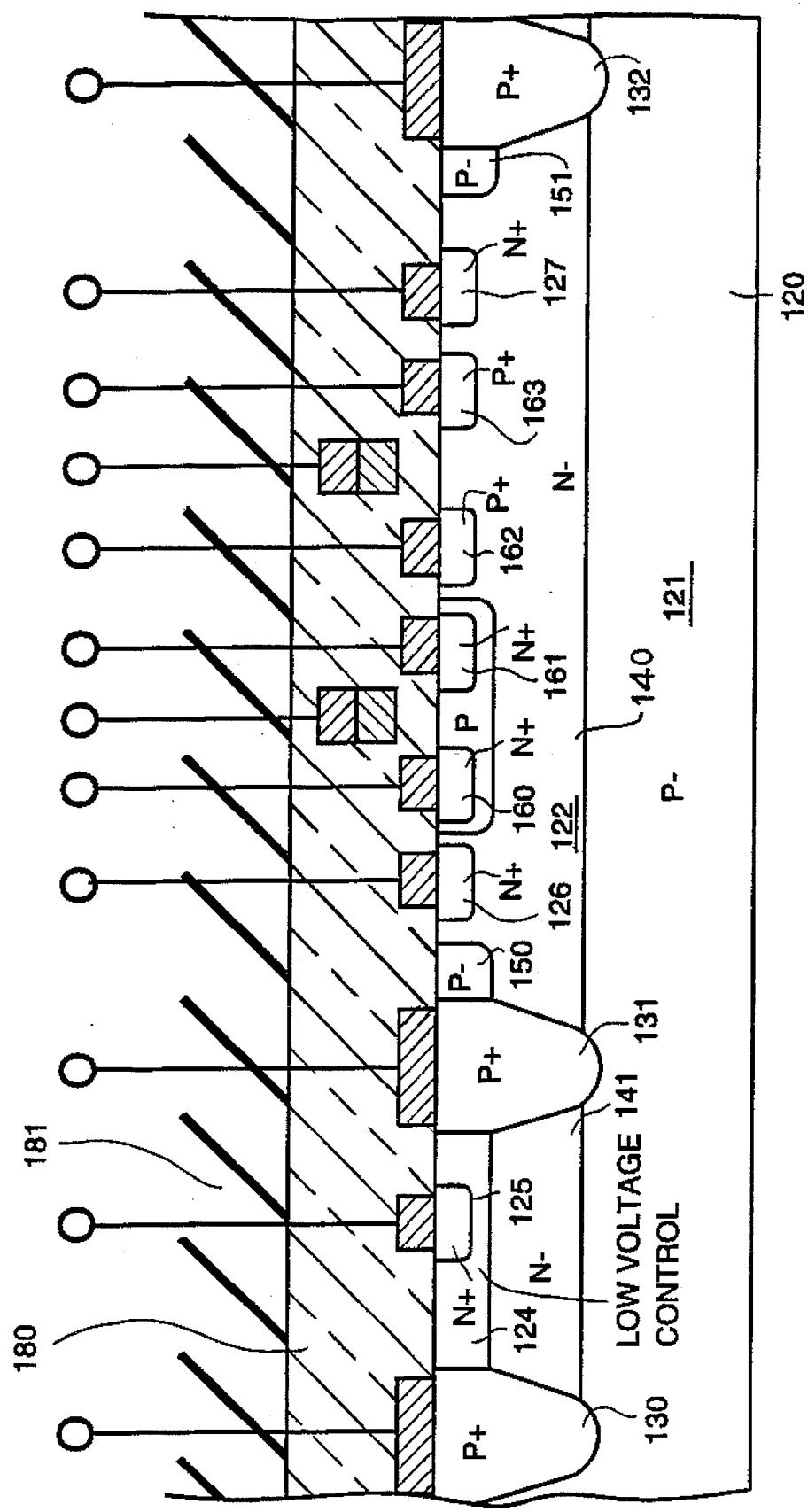
FIG. 3 is a cross-section of a portion of the circuit of the invention when integrated with a silicon chip.

FIG. 3 shows how a portion of the circuit of FIG. 2 can be implemented in an integrated circuit. When implementing the circuit of FIG. 2 in a common chip, the high and low voltage circuits are laterally isolated from one another. FIG. 3 shows a portion of such a chip cross section, in particular, the circuit coupled between $V_B$ and $V_S$ of circuit 11 of FIG. 2. Thus, in FIG. 3, a silicon chip 120 consists of a P(−) substrate having epitaxial layer 122 of N(−) silicon grown thereon. The N(−) region 122 is separated into high voltage and low voltage regions by P+ sinkers 130, 131 and 132. Thus sinkers 131 and 132 define a high voltage device region 141 in epitaxial layer 122, separated from low voltage region 140. Regions 140 and 141 can have any desired topology. Moreover, any desired isolation technique can be used between regions 140 and 141.

Typically, the driver circuit 17 of FIG. 2 comprises P channel and N channel MOSFETs. This is described in detail in copending application Ser. No. 08/299,561, referred to above, the disclosure of which is incorporated by reference herein. Also described therein, and known to those of skill in the art, is the low voltage control circuit for the high voltage circuit, which may comprise P channel and N channel MOSFETs.

The high voltage circuitry of these MOSFETs is shown in FIG. 3 as formed within high voltage region 140. The P+ contact regions 162 and 163, which are diffused in layer 122, represent any of the sources and drains of the P channel MOSFETs of the driver 17 of FIG. 2. The P region 164 is diffused in layer 122 to form a P-type well region. The N+ contact regions 160 and 161, which are diffused in the P-type region 164, represent any of the sources and drains of the N channel MOSFETs of the driver 17 of FIG. 2.

The low voltage control circuitry MOSFETs are schematically shown as formed within area 141 in FIG. 3. N+ region 125 is diffused in region 141 and receives an electrode which is at the low voltage supply $V_{CC}$. The low voltage control region 124 would also contain diffusions, not shown, identical to the diffusions 160 to 164 in the high voltage region 140. However, all the N+ and P+ diffusions in the low voltage control region 124 would receive electrodes which are between $V_{CC}$ and 0V and these would represent the sources and drains of the low voltage control circuit.

N+ contact regions 126 and 127 are diffused into layer 122 and receive metallic electrodes which can be at potentials between $V_B$ and $V_S$. The P+ sinkers 130, 131 and 132 receive electrodes which are at zero or ground potential. P(−) resurf regions 150 and 151 may encircle the high voltage region 140 to provide isolation from the low voltage region 141.

As is conventional, all devices within the silicon surfaces are overcoated by a dielectric, for example, a low temperature silicon dioxide (silox) layer 180 which may have a thickness of about 1.5 micrometers. Contacts to all surface electrodes penetrate the dielectric layer 180 and are taken to suitable external pin, not shown.

The device of FIG. 3 is also conventionally housed in a plastic housing 181 which overlies and contacts the upper surface of the completed chip as schematically shown in FIG. 3. Plastics used for the housing may be any suitable insulation material such as those sold under the tradenames Nitto MP-150SG, Nitto MP-180 and Hysol MG15-F.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high side MOSgated driver circuit which is operable from a low side input circuit and which has a reduced minimum turn off time in response to a fault condition; said driver circuit comprising, in combination:

a control logic signal circuit for receiving an input signal from said low side input circuit and related to the turn on and turn off of a high side power MOSgated device;

a level-shift circuit for level-shifting the signal from said control logic signal control circuit from the low side of said circuit to the high side of said driver circuit;

a first filter and latch circuit in the high side of said circuit and coupled to the high side of said level-shift up circuit;

a first coupling circuit coupling the output of said first filter and latch circuit to an output terminal for turning said high side power MOSgated device on and off in response to said input signal;

a fault current monitoring circuit for monitoring the current in said power MOSgated device and for producing an output signal in the present of a predetermined fault current condition;

a second fault latch circuit connected in the high side of said driver circuit;

a second coupling means for coupling the output of said fault latch circuit to said output terminal for turning off said high side power MOSgated device in response to the production of an output signal by said fault current monitoring circuit.

2. The device of claim 1 which further includes a fault reporting circuit in the low side of said driver circuit for producing an output signal in response to an output signal from said fault current monitoring circuit; a level-shift down circuit coupled between said fault latch means and said fault reporting circuit for level-shifting down the output of said fault latch to the input of said fault reporting circuit.

3. The device of claim 2 wherein said level-shifting down circuit contains a single PMOS transistor device.

4. The device of claim 1 wherein said first filter and latch circuit comprises an R-S latch and wherein said level-shift up circuit includes a first and a second NMOS transistor coupled to the R and S input terminals of said R-S latch respectively.

5. The device of claim 3 wherein said first filter and latch circuit comprises an R-S latch and wherein said level-shift up circuit includes a first and a second NMOS transistor coupled to the R and S input terminals of said R-S latch respectively.

6. The device of claim 2 wherein said fault latch is a second latch having a set terminal coupled to said fault current monitoring circuit and a reset terminal connected to said second coupling means.

7. The device of claim 6 wherein said first and second coupling circuits include control logic having its output coupled to an output high side terminal.

8. The device of claim 6 wherein said reset inputs of said first and second latches are reset in response to an input signal from said control logic circuit.

9. The device of claim 2 wherein said reset inputs of said first and second latches are reset in response to an input signal from said control logic circuit.

10. The device of claim 9 wherein said fault reporting circuit comprises a third R-S latch circuit having its set input connected to an output which is responsive to the operation of said fault responsive circuit and having its reset terminal coupled to the output of said control logic circuit.

11. The device of claim 1 wherein said driver circuit is integrated into a silicon chip; said chip having a floating well; said high side devices being integrated into said floating well.

12. The device of claim 6 wherein said driver circuit is integrated into a silicon chip; said chip having a floating well; said high side devices being integrated into said floating well.

13. The device of claim 7 wherein said driver circuit is integrated into a silicon chip; said chip having a floating well; said high side devices being integrated into said floating well.

14. The device of claim 10 wherein said driver circuit is integrated into a silicon chip; said chip having a floating well; said high side devices being integrated into said floating well.

* * * * *